(12) United States Patent
DeLuca

(10) Patent No.: US 6,895,096 B1
(45) Date of Patent: May 17, 2005

(54) MICROCHANNEL PLATE AUDIO AMPLIFIER

(76) Inventor: John P. DeLuca, 17210 Moore Rd., Boyds, MD (US) 20841

(*) Notice: Subject to any disclaimer, the term of this patent is extended or adjusted under 35 U.S.C. 154(b) by 0 days.

(21) Appl. No.: 09/557,090

(22) Filed: Apr. 21, 2000

Related U.S. Application Data

(60) Provisional application No. 60/130,270, filed on Apr. 21, 1999.

(51) Int. Cl.[7] .......................... H03F 21/00; H03F 3/38; H03F 1/00; H03F 1/20
(52) U.S. Cl. .......................... 381/120; 330/10; 330/42; 330/49
(58) Field of Search .......................... 381/120; 330/42, 330/49, 59, 10; 313/103 CM

(56) References Cited

U.S. PATENT DOCUMENTS

| | | | | |
|---|---|---|---|---|
| 2,226,077 A | * | 12/1940 | Snyder | 330/42 |
| 2,431,511 A | * | 11/1947 | Sanders | 330/42 |
| 2,546,992 A | * | 4/1951 | Ferguson | 330/42 |
| 3,513,345 A | * | 5/1970 | Feaster | 250/216 |
| 3,854,066 A | | 12/1974 | Payne | |
| 4,948,965 A | | 8/1990 | Feller | |
| 4,978,885 A | * | 12/1990 | White et al. | 313/103 CM |
| 4,988,867 A | * | 1/1991 | Laprade | 250/281 |
| 5,115,667 A | * | 5/1992 | Baret | 73/40.7 |
| 5,347,126 A | * | 9/1994 | Krauss et al. | 250/309 |
| 5,705,950 A | * | 1/1998 | Butler | 330/3 |
| 5,770,858 A | | 6/1998 | Fuchs et al. | |
| 5,896,459 A | * | 4/1999 | Williams, Jr. | 381/119 |

* cited by examiner

Primary Examiner—Forester W. Isen
Assistant Examiner—Devona E Faulk
(74) Attorney, Agent, or Firm—Dykema Gossett PLLC

(57) ABSTRACT

A audio amplifier employs microchannel plate for multiplying input electrons to produce output electrons at a rate corresponding to an audio input signal. The MCP may have a segment input source, segmented input and output electrodes or a segmented anode for allowing independent amplification of multiple input channels.

20 Claims, 5 Drawing Sheets

MICROCHANNEL PLATE AUDIO AMPLIFIER

CROSS-REFERENCE TO RELATED APPLICATION

This application is related to U.S. Provisional Application Ser. No. 60/130,270 filed Apr. 21, 1999, the teachings of which are incorporated herein by reference.

BACKGROUND OF THE INVENTION

This invention pertains to an audio amplifier, and in particular to an audio amplifier employing a microchannel plate (MCP).

Audio amplifiers using vacuum tubes have a characteristic sound which musicians and audiophiles find pleasing. In vacuum tube amplifiers, the input signal becomes distorted, especially when the input is overdriven. The distortion seems to result from clipping and rounding of the input waveform so that the resulting sound is softened. Solid state audio amplifiers do not amplify signals in the same way as tubes and thus do not exhibit the distinctive tube sound. Indeed, solid state devices produce a clean signal which to some sounds unpleasing, sharp and harsh. This seems to be the result of sharp clipping when the amplifier is overdriven.

The availability of high quality tubes for audio amplifiers is limited. Some foreign sources produce relatively inexpensive tubes which do not meet the requirements for high end equipment. Such tubes do not have sufficient consistency to be useful as matched pairs in push/pull amplifier configurations.

Domestically manufactured high quality tubes can be found, but such tubes are expensive. There is even a fairly active market in so called new old stock and used tubes. However, the availability of such tubes from a bygone era is limited.

Despite their inferior performance, transistors are popular because they are less expensive to manufacture and to operate, and they are more robust than tubes. Also, tubes require a hot filament to heat the cathode which consumes substantial energy and is a source of tube failure.

It is also difficult and expensive to build multiple channel tube amplifiers.

It is therefore desirable to provide an audio amplifier which mimics the tube sound and which is robust and has a reasonable cost. It is also desirable to provide equipment which will economically handle multiple channels using a common multichannel tube.

SUMMARY OF THE INVENTION

The present invention is based upon the discovery that a microchannel plate may be employed in as an audio amplifier.

In an exemplary embodiment, the invention comprises an audio amplifier for amplifying audio input signals including a microchannel plate for multiplying input electrons to produce output electrons at a rate corresponding to the input audio signal.

In one embodiment, the amplifier includes means for modulating the microchannel plate with the input signal.

In another embodiment, the amplifier includes means for modulating the input electrons.

In yet another embodiment, the amplifier includes a light responsive source of electrons and means for modulating the light source. The light source may be a coherent light source such as a laser or a focused incoherent light source.

In another embodiment, the invention employs a device in which multiple channels are independently operable for amplifying various inputs and providing separate amplified outputs.

The invention may also be employed to distort the input signal so as to mimic a vacuum tube. As such, the invention may act as a low power preamplifier for driving a downstream power amplifier whereby the power amplifier may simply reproduce the distorted preamplified signal.

DETAILED DESCRIPTION OF THE INVENTION

Figure 1:
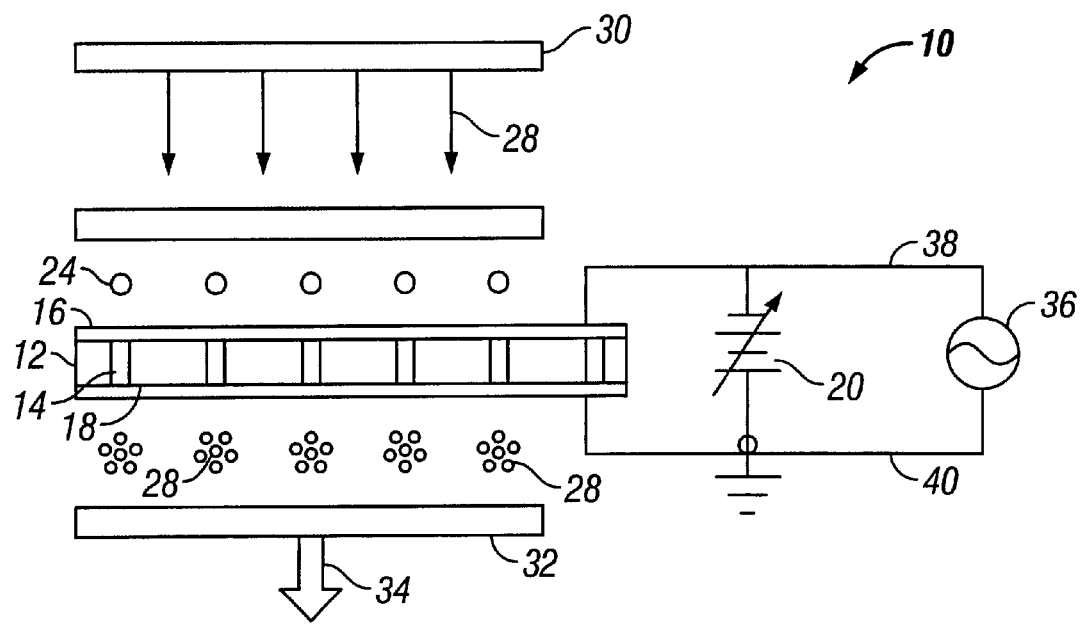
FIG. 1 is a schematic illustration of a microchannel plate audio amplifier employing a modulating voltage source between the input and output.

FIG. 1 illustrates a simplified audio amplifier employing a microchannel plate (MCP) 12 having a plurality of channels or apertures 14 and respective input and output electrodes 16 and 18. A high voltage source 20 (e.g., 2000v) is coupled to the electrodes 16 and 18 as shown. The input electrode 16 is typically at around 2000 volts and the output electrode 18 is at or near ground. An electron source, for example a photocathode 22, produces source electrons 24 in response to input illumination 26 from light source 30. The source electrons 24, enter the channels 14, and by multiple collisions, produce output electrons 28 at a gain of about $10^6$. The output electrons 28 are collected by an anode 32 to produce an output signal 34.

In accordance with the invention, a signal source 36 has outputs 38 and 40 coupled across MCP 12 at respective input electrodes 16 and 18, the signal source 36 may be an audio signal from any appropriate audio source such as an electrical guitar output, a compact disc player or other electrical instrument. The audio source 36 modulates the gain of the MCP 12 such that the output signal 34 varies in an exemplary range of about 50 V. The output electrodes 18 may be grounded as shown.

Figure 2:
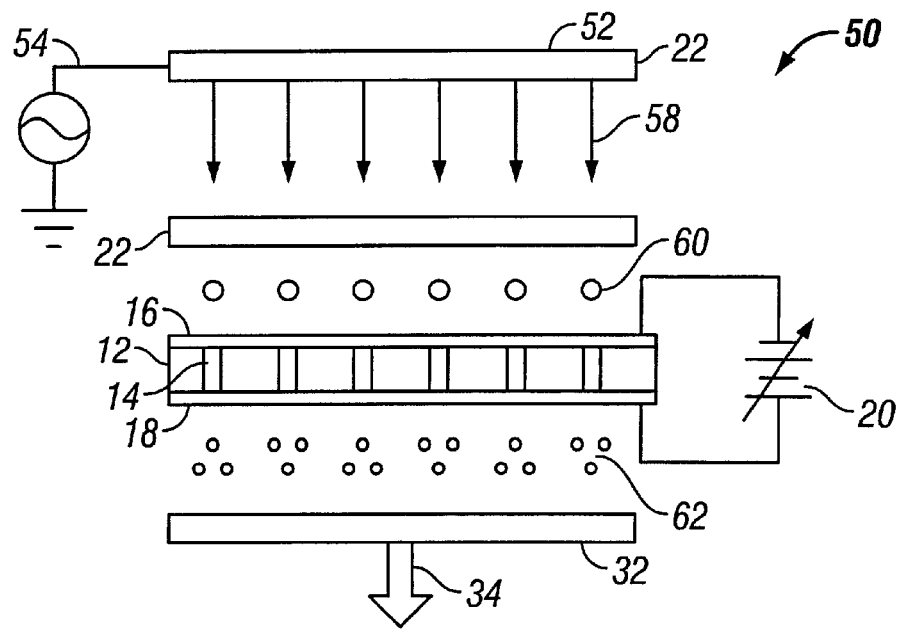
FIG. 2 is a schematic illustration of an MCP audio amplifier employing a modulating light source as the input.

FIG. 2 illustrates a microchannel plate audio amplifier 50 similar to the arrangement of FIG. 1 wherein a similar elements carry the same reference numerals, wherein the gain of the MCP 12 is controlled by the high voltage source 20. A light source 52 driven by a signal source 54 at output 56 causes the light source 52 to produce modulated output light 58 which stimulates the photocathode 22 to produce modulated input electrons 60. In accordance with the invention, the input electrons 60 are produced in greater or lesser quantities depending upon the intensity of the modulated light 58. The input electrons 60 enter the channels 14 and are amplified by the microchannel plate producing modulated output electrons 62 at a gain of roughly about 106. The anode 30 collects the electrons and produces an audio output signal 34 as shown.

Figure 3:
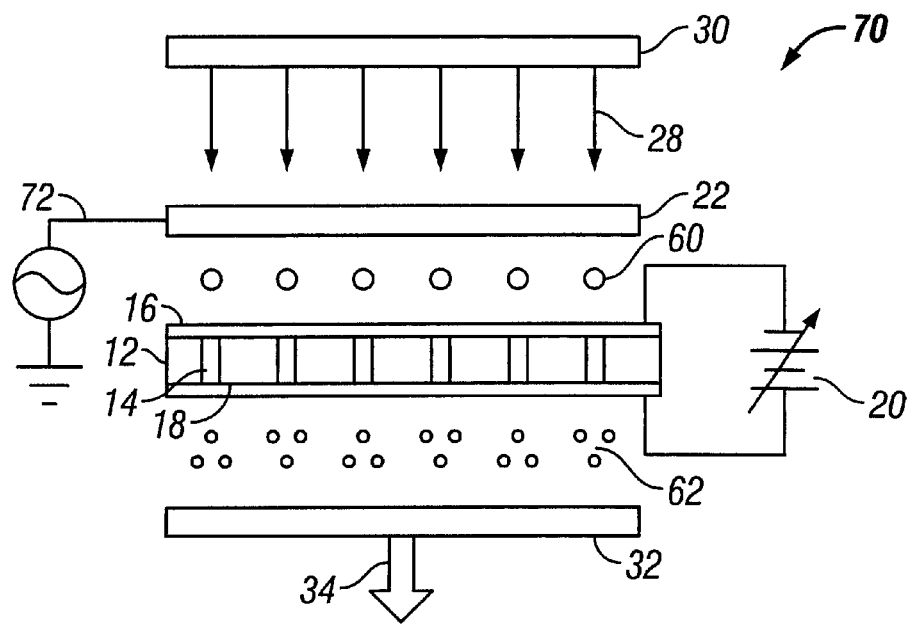
FIG. 3 is a schematic illustration of an MCP audio amplifier employing a modulated photocathode.

FIG. 3 illustrates a multichannel plate audio amplifier 70 wherein the light 28 from source 30 simulates the photocathode 22 which is modulated by the audio source 24. Like the arrangement in FIG. 2, modulated input electrons 60 are produced which are amplified by the MCP 12 resulting in modulated output electrons 62 which are collected by the anode 32 producing an audio signal on the output 34.

Figure 4:
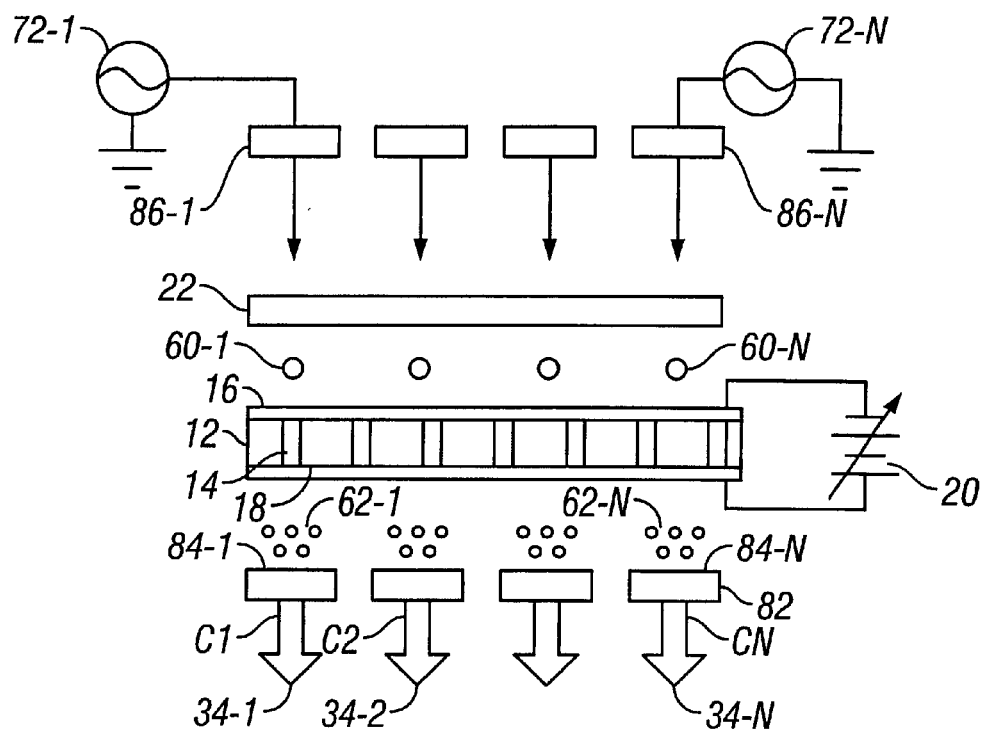
FIG. 4 schematically illustrates a multichannel MCP audio amplifier.
Figure 5:
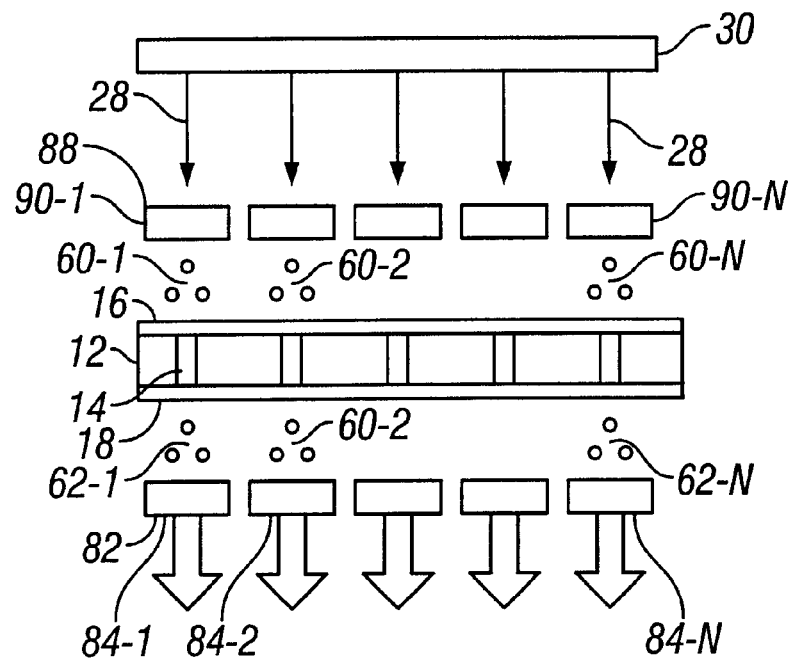
FIG. 5 is a schematic illustration of a multichannel MCP audio amplifier having a photocathode.
Figure 6:
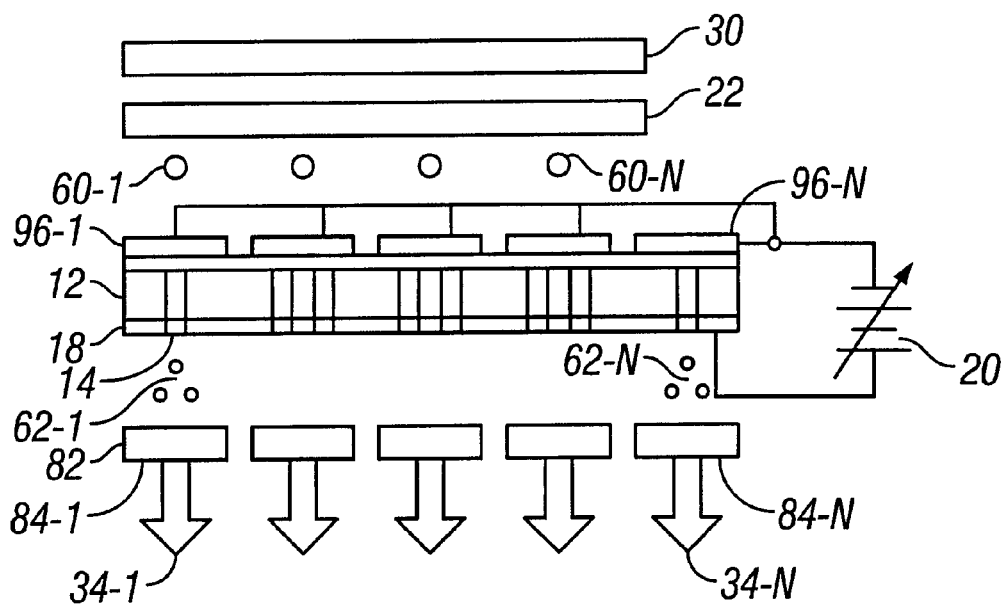
FIG. 6 is a schematic illustration of a multichannel MCP audio amplifier having a segmented input electrode.
Figure 7:
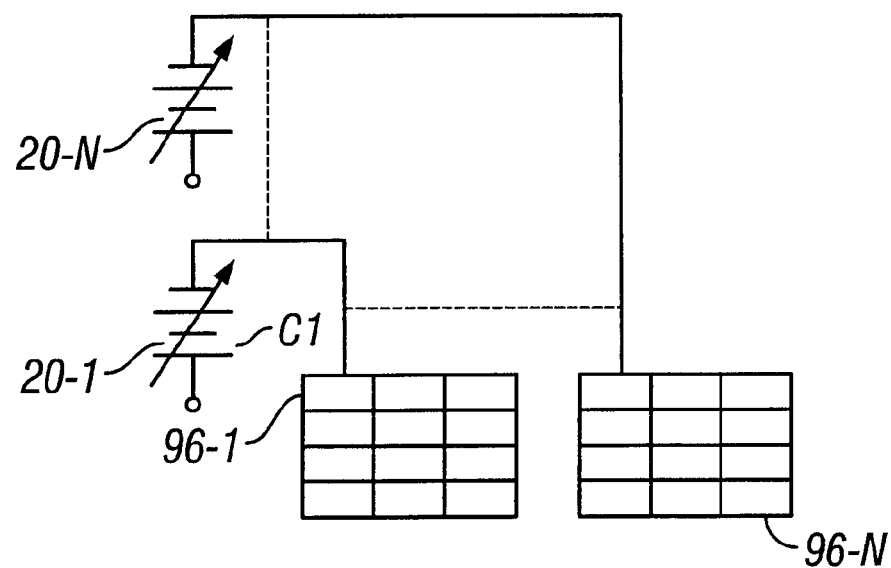
FIG. 7 is a fragmentary schematic illustration of a segmented MCP amplifier having a separate variable high voltage sources.
Figure 8:
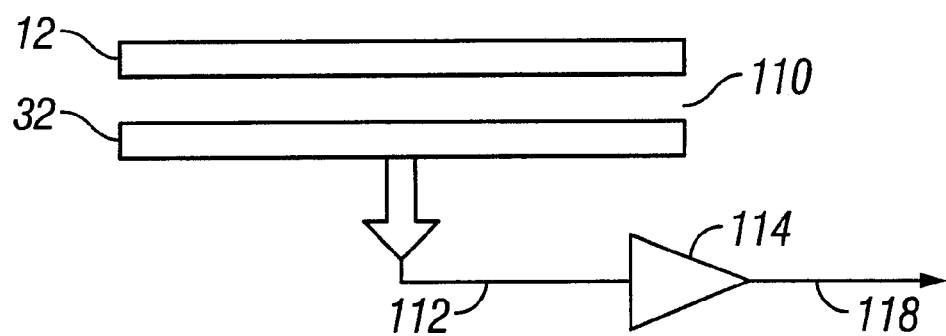
FIG. 8 illustrates an MCP preamplifier which feeds the input to a power amplifier.

FIG. 4 illustrates a multichannel, microchannel plate audio amplifier 80 having a segmented anode 82 containing anode segments 84-1 . . . 84-N. Each of the anode segments 84 corresponds to a channel C1-CN. In the exemplary embodiment signal sources 72-1 . . . 72-N modulate light source 86-1 . . . 86-N for each corresponding channel C1-CN to stimulate the photocathode 22 producing input electrons 60-1 . . . 60-N which are collected as output electrons 62-1 . . . 62-N by the corresponding anode segments 84-1 . . . 84-N resulting in separate outputs 32-1 . . . 32-N. The light source 86 may be modulated from a modulated laser, one for each channel C1-CN. Alternatively, the input signal may be provided by modulating a segmented photocathode 88 having segments 90-1 . . . 90-N as shown in FIG. 5. Alternatively, the input electrodes 16 of the microchannel plate 12 may be segmented into segments 96-1 . . . 96-N forming amplification channels C-1 . . . C-N which are aligned with the segmented anode 84-1 . . . 84-N as shown in FIG. 6. It is envisioned that the gain of the MCP 12 may be governed by a uniform high voltage, and the level of the input signal may be increased or decreased to effect the gain. Alternatively, the high voltage on the segments 96-1 . . . 96-N may be separately increased or decreased to provide for separate amplification. As shown in FIG. 7, the high voltage 20-1 . . . 20-N may be separately varied. In accordance with another embodiment of the invention as shown in FIG. 8, the signal source may be the output of an MCP amplifier 110 according to any of the arrangements illustrated. The MCP may provide a preamplified, softly distorted input signal 112 to a power amplifier 114. The distorted input 112 may be accurately reproduced at the output 118 to provide a pleasing tube sound.

Figure 9:
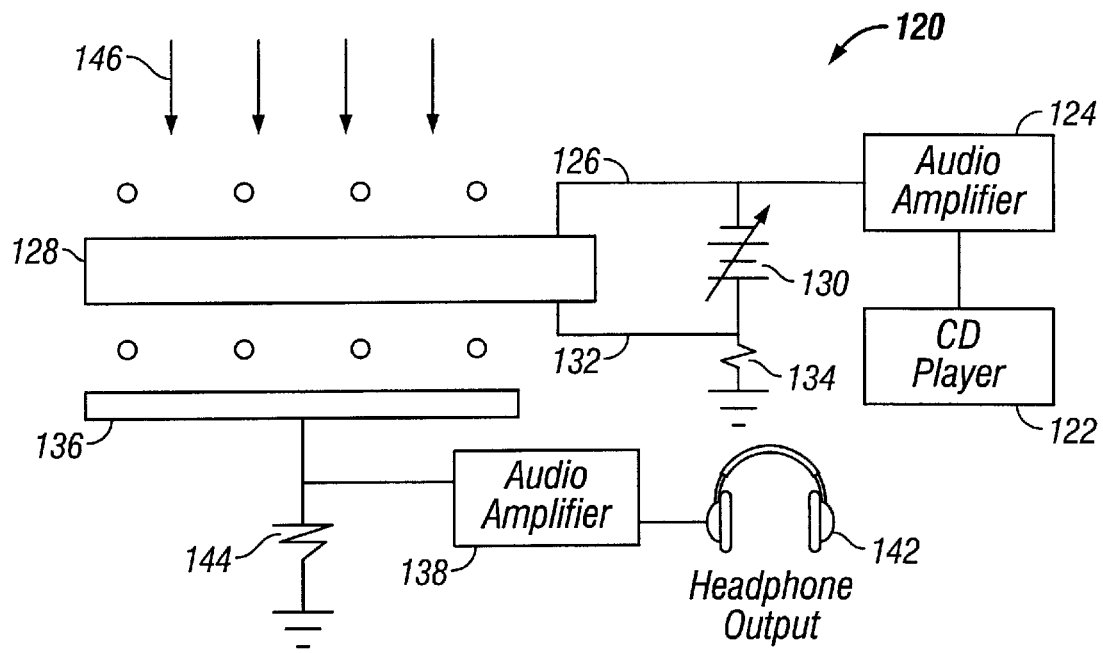
FIG. 9 is a schematic illustration of an exemplary audio amplifier employing an MCP.

FIG. 9 illustrates a schematic illustration of an audio amplifier 120 in accordance with an embodiment to the invention wherein a CD player 122 providing an audio source is coupled to an audio amplifier 124, the output of the audio amplifier 124 is coupled to the input side 126 of microchannel plate 128. A negative high voltage source 130 is likewise coupled to the input side to provide a fixed bias. The output side 132 of the MCP 128 may be coupled to ground or near ground through a resistor 134. The anode 136 is coupled to an audio amplifier 138 over a shielded line 140. The output of the audio amplifier 138 may be used to drive a appropriate transducer such as headphones or speakers 142. A bias resistor 144 isolates the anode 136 from ground as shown. In the embodiment illustrated, input radiation 146 may be in the form of a beam of energetic particles, e.g. neutrons to activate the MCP 128. Other arrangements are also possible.

Figure 10:
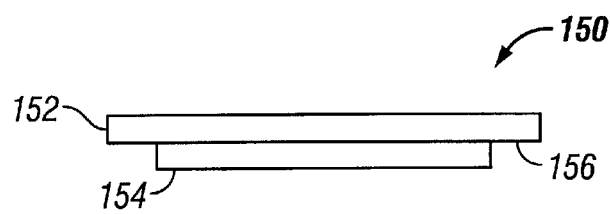
FIG. 10 is a schematic illustration of a cooled MCP amplifier.

FIG. 10 illustrates a microchannel plate amplifier 150 in which the microchannel plate 152 is secured to a heat sink 154 to cool the active output side 156 as shown. Such an arrangement allows for active cooling of the microchannel plate to increase the power output of the amplifier.

Figure 11:
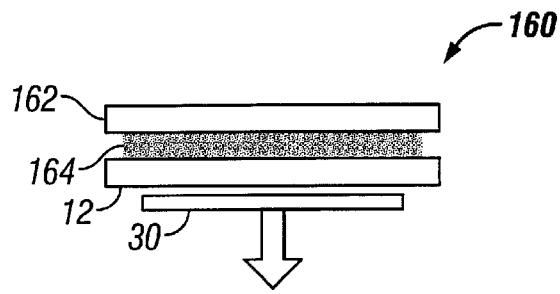
FIG. 11 is a schematic illustration of a microchannel plate audio amplifier employing an MCP electron source.

In another embodiment of the invention, an amplifier 160 employs an electron source in the form of a microchannel plate 162 driven to saturation and operating under conditions of self sustained ion regeneration producing active particles 164 as inputs to microchannel plate 12 as shown in FIG. 11.

While there have been described what are considered to be the preferred embodiments of the present invention, it will be apparent to those skilled in the art that various changes in modification may be made therein without departing from the invention and is intended in the depended claims to cover such variations which fall within the scope of the invention.

What is claimed:

1. An audio signal amplifier for mimicking the response of a vacuum tube amplifier comprising:
   and electron multiplier having and input and an output;
   means for producing a plurality of audio signals;
   means for connecting said audio signals to the input; and
   means for modulating the audio signals to vary an amplified audio signal appearing at the output of said electron multiplier, wherein the amplified audio output comprises a distorted reproduction of the input audio signals, which distortion mimics a vacuum tube amplifier.

2. The audio signal amplifier of claim 1, wherein the electron multiplier comprises a microchannel plate (MCP).

3. The amplifier of claim 2 wherein the MCP includes input and output electrodes and the means for modulating the audio signals comprises a modulated voltage source coupled between the input and the out electrodes.

4. The amplifier of claim 2 wherein the means for connecting said audio signals to said input includes an input electron source for stimulating the MCP with input electrons.

5. The amplifier of claim 4, wherein the input electron source comprises a photocathode.

6. The amplifier of claim 5, wherein the means for modulating the audio signals comprises means for varying the input electrons in accordance with the audio signals.

7. The amplifier of claim 5, wherein the photocathode is responsive to light for producing the input electrons, and the means for modulating the MCP comprises means for directing modulated light at the photocathode for producing modulated input electrons.

8. The amplifier of claim 6, wherein the means for modulating the input signal comprise means coupled to the photocathode for producing modulated input electrons in accordance with the input audio signals.

9. The amplifier of claim 1 further including an anode.

10. The amplifier of claim 9, wherein the anode is segmented for producing an amplified output signal in each segment.

11. The amplifier of claim 2 wherein the MCP is segmented into a plurality of active areas for producing output electrons corresponding to each of said active areas.

12. The amplifier of claim 1, wherein the means for producing the plurality of input signal comprises a segmented photocathode.

13. The amplifier of claim 1, wherein the means for modulating the input signals comprises a plurality of means for producing a plurality of input electrons.

14. The amplifier of claim 1, further including an amplifier response to the output of the electron multiplier for further amplifying the output thereof.

15. An audio amplifier for producing an amplified audio output signal in response in an audio input signal comprising:
   a source of input photons;
   a photocathode for producing input electrons in response to the input photons;
   a microchannel plate (MCP) having an input and an output, said MCP being responsive to the input electrons for multiplying said input electrons to produce output electrons in response thereto; and
   means for modulating at least one of the source, the photocathode and the MCP in accordance with the input audio signal such that the MCP produces the amplified output signal.

16. An audio signal amplifier for amplifying an audio input signal comprising:
   a laser source;
   a photocathode responsive to the light source for producing input electrons in response thereto;
   a microchannel plate (MCP) electron multiplier having an input response to the input electrons and an output for producing output electrons in response thereto; and
   means for modulating the audio input signal to vary an amplified audio signal appearing at the output of the MCP.

17. An audio signal amplifier for amplifying an audio signal and producing an amplified output audio signal comprising:
   a first electron multiplier having a variable gain, an input for receiving input electrons, and an output for producing multiplied output electrons thereat;
   a second electron multiplier for producing a source of input electrons for the first electron multiplier; and
   means operatively coupled in the first electron multiplier for modulating the gain to vary the amount of multiplied output electrons appearing at the output of the first electron multiplier corresponding to the amplified output audio signal.

18. An amplifier for amplifying an audio input signal and producing an amplified audio output signal comprising:
   a source of input photons;
   a photocathode for producing input electrons in accordance with the input photons;
   an electron multiplier having an input and an output, the electron multiplier being responsive to the input electrons for producing the amplified audio output signal at the output;
   means for modulating the audio input signal to vary the output of the electron multiplier to produce the amplified audio output signal, wherein said amplified audio output signal comprises a distorted reproduction of the audio input signal, which distortion mimics a vacuum tube amplifier.

19. The amplifier of claim 18, wherein the source of photons comprises a laser.

20. An audio signal amplifier for mimicking the response of a vacuum tube amplifier comprising:
   an electron multiplier having and input and an output;
   means for producing at least one audio input signal;
   means for connecting said audio signal to the input; and
   means for modulating the audio input signal to vary an amplified audio output signal appearing at the output of said electron multiplier, wherein the amplified audio output signal comprises a distorted version of the audio input signal, which distortion mimics a vacuum tube amplifier.

* * * * *